United States Patent
Lu et al.

(10) Patent No.: US 8,735,268 B2
(45) Date of Patent: May 27, 2014

(54) METHOD FOR FABRICATING METAL-OXIDE-SEMICONDUCTOR FIELD-EFFECT TRANSISTOR

(75) Inventors: Ching-Sen Lu, Tainan (TW); Wen-Han Hung, Kaohsiung (TW); Tsai-Fu Chen, Hsinchu (TW); Tzyy-Ming Cheng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 301 days.

(21) Appl. No.: 13/165,854

(22) Filed: Jun. 22, 2011

(65) Prior Publication Data

US 2012/0329259 A1 Dec. 27, 2012

(51) Int. Cl.
*H01L 21/28* (2006.01)
*H01L 29/66* (2006.01)
*H01L 29/78* (2006.01)

(52) U.S. Cl.
CPC ...... *H01L 29/66545* (2013.01); *H01L 29/6653* (2013.01); *H01L 29/6656* (2013.01); *H01L 29/7847* (2013.01)
USPC .......................................... 438/586; 438/595

(58) Field of Classification Search
USPC .................................................. 438/595, 586
See application file for complete search history.

(56) References Cited

U.S. PATENT DOCUMENTS

| | | | |
|---|---|---|---|
| 7,307,320 B2 * | 12/2007 | Sun et al. ...................... | 257/368 |
| 7,314,793 B2 | 1/2008 | Frohberg et al. | |
| 2006/0099763 A1 | 5/2006 | Liu et al. | |
| 2012/0248511 A1 | 10/2012 | Guo et al. | |

FOREIGN PATENT DOCUMENTS

| | | |
|---|---|---|
| CN | 101285972 A | 10/2008 |
| CN | 101414583 A | 4/2009 |
| KR | 100418031 B1 | 11/2002 |

OTHER PUBLICATIONS

S. Yamakawa, S. Mayuzumi, Y. Tateshita, H. Wakabayashi, and H. Ansai, "Stress Enhancement Concept on Replacement Gate Technology with Top-Cut Stress Liner for nFETs", Semiconductor Technology Development Division, Semiconductor Business Group, Sony Corporation, Atsugi, Kanagawa, 243-0014, Japan, 2008.
U.S. Appl. No. 13/078,001; applied on Apr. 1, 2011.
T. Ghani, M. Armstrong, C. Auth, M. Bost, P. Charvat, G. Glass, T. Hoffmann*, K. Johnson#, C. Kenyon, J. Klaus, B. McIntyre, K. Mistry, A. Murthy, J. Sandford, M. Silberstein, S. Sivakumar, P. Smith, K. Zawadzki, S. Thompson and M. Bohr; A 90nm High Volume Manufacturing Logic Technology Featuring Novel 45nm Gate Length Strained Silicon CMOS Transistors; Portland Technology Development, * TCAD, # QRE, Intel Corp., Hillsboro, OR; 2003 IEEE.
China Patent Office, "Office Action", Jan. 30, 2014.

* cited by examiner

*Primary Examiner* — Alexander Ghyka
(74) *Attorney, Agent, or Firm* — WPAT, PC; Justin King

(57) ABSTRACT

A method for fabricating a metal-oxide-semiconductor field-effect transistor includes the following steps. Firstly, a substrate is provided. A gate structure, a first spacer, a second spacer and a source/drain structure are formed over the substrate. The second spacer includes an inner layer and an outer layer. Then, a thinning process is performed to reduce the thickness of the second spacer, thereby retaining the inner layer of the second spacer. After a stress film is formed on the inner layer of the second spacer and the source/drain structure, an annealing process is performed. Afterwards, the stress film is removed.

14 Claims, 4 Drawing Sheets

METHOD FOR FABRICATING METAL-OXIDE-SEMICONDUCTOR FIELD-EFFECT TRANSISTOR

FIELD OF THE INVENTION

The present invention relates to a method for fabricating a semiconductor device, and more particularly to a method for fabricating a metal-oxide-semiconductor field-effect transistor.

BACKGROUND OF THE INVENTION

Because the length of the gate can not be limitlessly reduced any more and new materials have not been proved to be used in a metal-oxide-semiconductor field-effect transistor (MOSFET), adjusting mobility has become an important role to improve the performance of the integrated circuit. For example, the lattice strain of the channel is widely applied to increase mobility during the process of fabricating the MOSFET. For example, the hole mobility of the silicon with the lattice strain can be 4 times as many as the hole mobility of the silicon without the lattice strain, and the electron mobility with the lattice strain can be 1.8 times as many as the electron mobility of the silicon without the lattice strain.

Consequently, a tensile stress can be applied to an n-channel of an n-channel metal-oxide-semiconductor field-effect transistor (NMOS) by changing the structure of the transistor, or a compressive stress can be applied to a p-channel of a p-channel metal-oxide-semiconductor field-effect transistor (PMOS) by changing the structure of the transistor. Based on these characteristics, a stress memorization technique (SMT) is developed. However, the performance of the semiconductor device fabricating by the current stress memorization technique is still unsatisfied. Therefore, there is a need of providing an improved method for fabricating a metal-oxide-semiconductor field-effect transistor.

SUMMARY OF THE INVENTION

In accordance with an aspect, the present invention provides a method for fabricating a metal-oxide-semiconductor field-effect transistor. The method includes the following steps. Firstly, a substrate is provided. A gate structure, a first spacer, a second spacer and a source/drain structure are formed over the substrate. The second spacer includes an inner layer and an outer layer. Then, a thinning process is performed to reduce the thickness of the second spacer, thereby retaining the inner layer of the second spacer. After a stress film is formed on the inner layer of the second spacer and the source/drain structure, an annealing process is performed. Afterwards, the stress film is removed.

In an embodiment, the substrate is a silicon substrate. The gate structure includes a gate dielectric layer, a barrier metal layer, a polysilicon dummy gate and a hard mask layer. The first spacer is a silicon nitride layer or a multi-layered structure including a silicon dioxide layer and a silicon nitride layer. The inner layer of the second spacer is made of silicon dioxide. The outer layer of the second spacer is made of silicon nitride.

In an embodiment, the gate dielectric layer includes an interlayer and a high-K dielectric layer. The high-K dielectric layer is made of hafnium dioxide. The interlayer is made of silicon dioxide. The barrier metal layer is made of titanium nitride. The hard mask layer comprises a silicon nitride layer and a silicon dioxide layer.

In an embodiment, the source/drain structure is formed in the substrate by performing an ion-implanting process to transform a crystal phase of the silicon substrate into an amorphous phase.

In an embodiment, the step of thinning the second spacer is performed by using a hot phosphoric acid solution to wet etch the second spacer, so that the outer layer of the second spacer is removed but the inner layer of the second spacer is retained.

In an embodiment, after the stress film is removed, the method further includes steps of forming a contact etch stop layer and an interlayer dielectric layer over the substrate, performing a chemical mechanical polishing process to remove a portion of the contact etch stop layer, a portion of the interlayer dielectric layer and the hard mask layer to expose the polysilicon dummy gate, removing the exposed polysilicon dummy gate to create a trench, and filling a metal gate structure into the trench.

In an embodiment, the step of filling a metal gate structure is performed by sequentially filling an etch stop layer, a work function metal layer and a metal gate into the trench.

In an embodiment, the etch stop layer is made of made of titanium nitride (TiN), the work function metal layer is made of titanium nitride (TiN) or titanium aluminum (TiAl), and the metal gate is made of aluminum (Al).

In an embodiment, after the stress film is removed, the method further includes a step of forming a salicide layer on the source/drain structure.

In an embodiment, the stress film is a silicon nitride film or a composite film including a buffer oxide film and a silicon nitride film.

In an embodiment, the metal-oxide-semiconductor field-effect transistor is a p-channel metal-oxide-semiconductor field-effect transistor, and the stress film is a compressive stress film.

In an embodiment, the metal-oxide-semiconductor field-effect transistor is an n-channel metal-oxide-semiconductor field-effect transistor, and the stress film is a tensile stress film.

In an embodiment, the step of removing the stress film is performed by a wet etching process.

In an embodiment, the method further includes steps of forming a contact hole over the source/drain structure to expose a surface of the source/drain structure, and forming a salicide layer on the exposed surface of the source/drain structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

For improving the stress memorization technique, the present invention provides a method for fabricating a metal-oxide-semiconductor field-effect transistor. FIGS. 1A~1G are schematic cross-sectional views illustrating a method for fabricating a metal-oxide-semiconductor field-effect transistor according to an embodiment of the present invention.

Figure 1A:
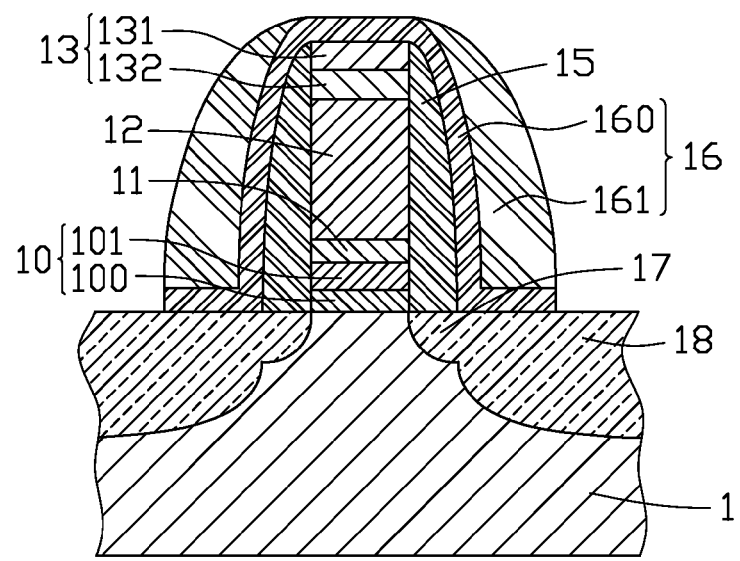
FIGS. 1A~1G are schematic cross-sectional views illustrating a method for fabricating a metal-oxide-semiconductor field-effect transistor according to an embodiment of the present invention.

Firstly, a silicon substrate 1 is provided. After a front-end processes for producing a metal-oxide-semiconductor field-effect transistor is performed, the resulting structure is shown in FIG. 1A. A gate structure including a gate dielectric layer 10, a barrier metal layer 11, a polysilicon dummy gate 12 and a hard mask layer 13 is formed over the silicon substrate 1. The gate dielectric layer 10 is a multi-layered structure including an interfacial layer 100 and a high-K dielectric layer 101. For example, the interfacial layer 100 is made of silicon dioxide ($SiO_2$), the high-K dielectric layer is made of hafnium dioxide ($HfO_2$), and the barrier metal layer 11 is made of titanium nitride (TiN). In addition, the hard mask layer 13 comprises a silicon nitride (SiN) layer 132 and a silicon dioxide layer 131.

Please refer to FIG. 1A again. A first spacer 15 and a second spacer 16 are formed on a sidewall of the gate structure. By using the gate structure, the first spacer 15 and the second spacer 16 as an implantation mask, a series of ion-implanting processes are performed to form a lightly doped drain (LDD) region 17 and a source/drain structure 18 in the silicon substrate 1. The first spacer 15 is a pure silicon nitride layer or a multi-layered structure including a silicon dioxide layer and a silicon nitride layer. The second spacer 16 comprises an inner layer 160 and an outer layer 161. For example, the inner layer 160 is made of silicon dioxide, and the outer layer 161 is made of silicon nitride. After the LDD region 17 and the source/drain structure 18 are formed in the silicon substrate 1, the crystal phase of the silicon substrate 1 is transformed into an amorphous phase. Meanwhile, the front-end process for producing the metal-oxide-semiconductor field-effect transistor by means of the stress memorization technique is completed.

Figure 1B:
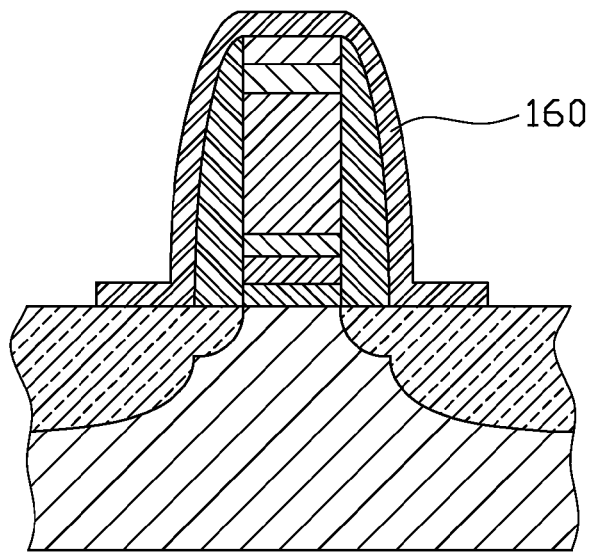

Then, as shown in FIG. 1B, a wet etching process is performed to thin the second spacer 16, thereby reducing the thickness of the second spacer 16. In a case that the outer layer 161 of the second spacer 16 is made of silicon nitride, since the etching selectivity ratio of silicon nitride to the silicon dioxide with the phosphoric acid solution is very high, a hot phosphoric acid ($H_3PO_4$) solution may be used as an etchant solution to remove the outer layer 161. After the wet etching process is performed, the outer layer 161 of the second spacer 16 is removed, but the inner layer 160 of the second spacer 16 is retained. Moreover, as shown in FIG. 1B, the retained inner layer 160 is an L-shaped silicon dioxide layer.

Figure 1C:
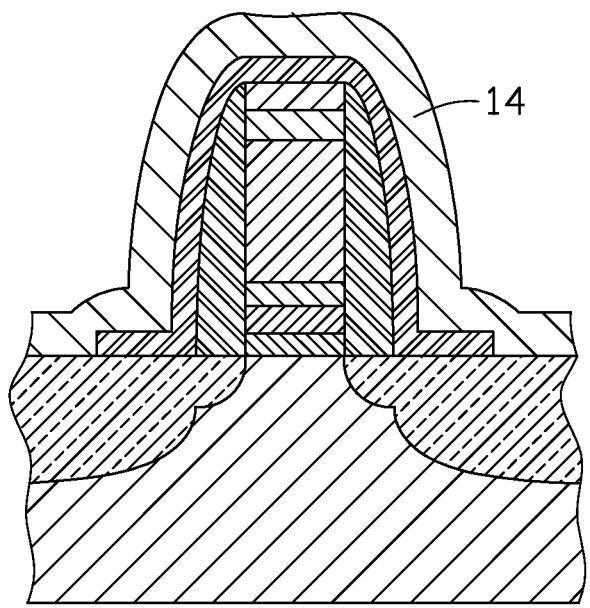

Then, as shown in FIG. 1C, a stress film 14 for implementing the stress memorization technique is deposited on the inner layer 160 of the second spacer 16 and the source/drain structure 18. For example, the stress film 14 is a silicon nitride film. Alternatively, the stress film 14 is a composite film including a buffer oxide film and a silicon nitride film. According to various depositing conditions, the silicon nitride film can be controlled to have the function of a tensile stress film or a compressive stress film. For example, the compressive stress film for increasing the hole mobility of the P-channel may be simply formed by a chemical vapor deposition (CVD) process. Whereas, the tensile stress film for increasing the electron mobility of the N-channel is formed by a plurality of deposition and curing cycle processes. After the step of depositing the stress film 14, the LDD region 17 and the source/drain structure 18 in the amorphous phase are subject to an annealing process. Due to the annealing process, the amorphous phases of the LDD region 17 and the source/drain structure 18 are transformed and restored into the crystal phases. Meanwhile, the stress provided by the stress film 14 can be effectively memorized.

Figure 1D:
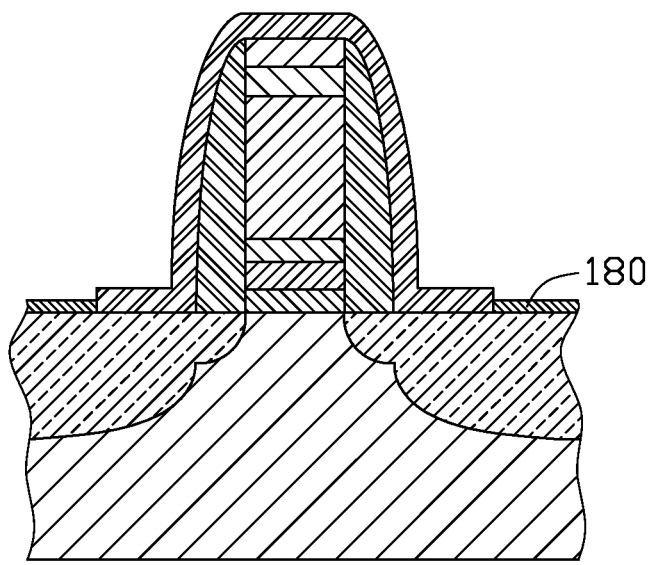

Then, as shown in FIG. 1D, a wet etching process is performed to remove the stress film 14, thereby exposing the L-shaped silicon dioxide layer. In a case that the stress film 14 is made of silicon nitride, a hot phosphoric acid ($H_3PO_4$) solution may be used as an etchant solution. Then, a self-aligned silicidation process is performed to form a salicide layer 180 on the source/drain structure 18. Alternatively, the salicide layer 180 may be formed immediately after the second spacer 16 is formed.

Figure 1E:
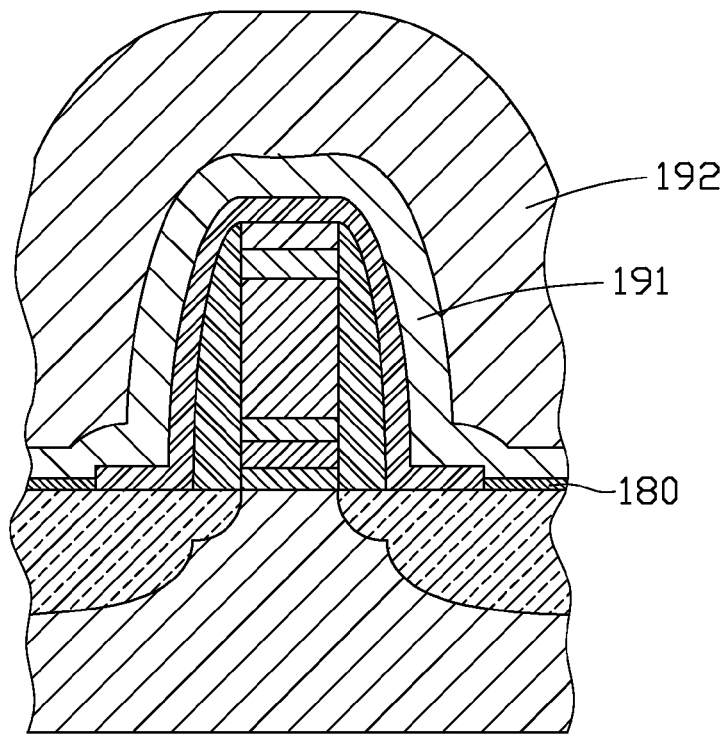

Then, as shown in FIG. 1E, a contact etch stop layer (CESL) 191 and an interlayer dielectric layer (ILD) 192 are formed over the resulting structure of FIG. 1D.

Figure 1F:
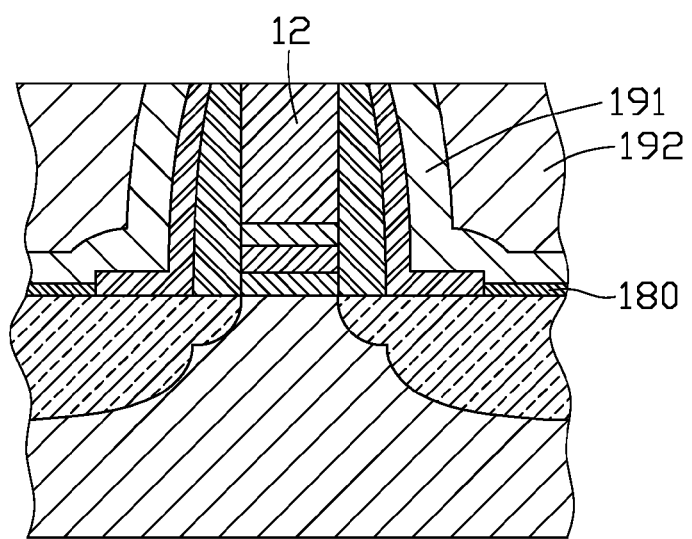
Figure 1G:
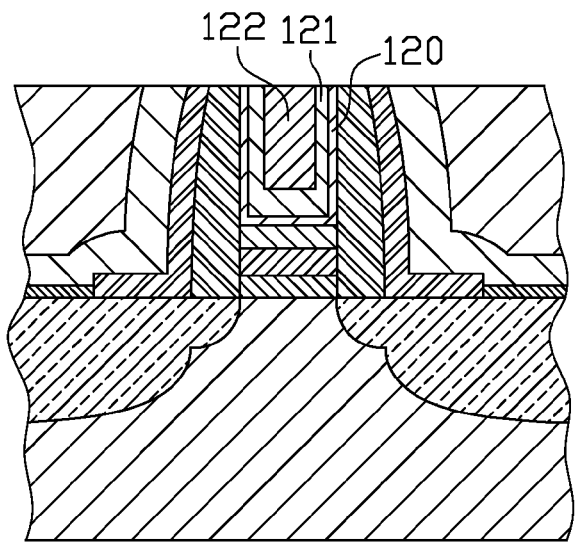

Then, as shown in FIG. 1F, a chemical mechanical polishing (CMP) process is performed to remove a portion of the contact etch stop layer 191, a portion of the interlayer dielectric layer 192 and the hard mask layer 13, so that the polysilicon dummy gate 12 is exposed.

Then, a wet etching process is performed to remove the exposed polysilicon dummy gate 12, thereby creating a trench. Then, a metal gate structure is filled into the trench. As shown in FIG. 1F, the metal gate structure comprises an etch stop layer 120, a work function metal layer 121 and a metal gate 122. Meanwhile, a metal-oxide-semiconductor field-effect transistor with a gate-last high-k metal gate (HKMG) is fabricated. For example, the etch stop layer 120 is made of made of titanium nitride (TiN). For the P-channel MOSFET, the work function metal layer 121 is made of titanium nitride (TiN). For the N-channel MOSFET, the work function metal layer 121 is made of titanium aluminum (TiAl). The metal gate 122 is made of aluminum (Al).

In the above embodiment, since the silicon nitride layer 161 of the second spacer 16 is removed by the back-etch process, the stress provided to the amorphous phases of the LDD region 17 and the source/drain structure 18 can be efficiently memorized. Therefore, the efficacy of adjusting mobility of the channel of the metal-oxide-semiconductor field-effect transistor will be enhanced.

In the above embodiment, the metal-oxide-semiconductor field-effect transistor is fabricated by a gate-last process. Nevertheless, the metal-oxide-semiconductor field-effect transistor may be fabricated by a gate-first process. The steps of the gate-first process are substantially identical to those of the gate-first process except that the steps of removing the polysilicon dummy gate 12 and filling the work function metal layer 121 and a metal gate 122 are omitted.

In some embodiments, the high-K dielectric layer 101 is not previously formed in the step as shown in FIG. 1A. After the polysilicon dummy gate 12 is removed, the high-K dielectric layer 101, the etch stop layer 120, the work function metal layer 121 and the metal gate 122 are sequentially filled into the trench.

Figure 2:
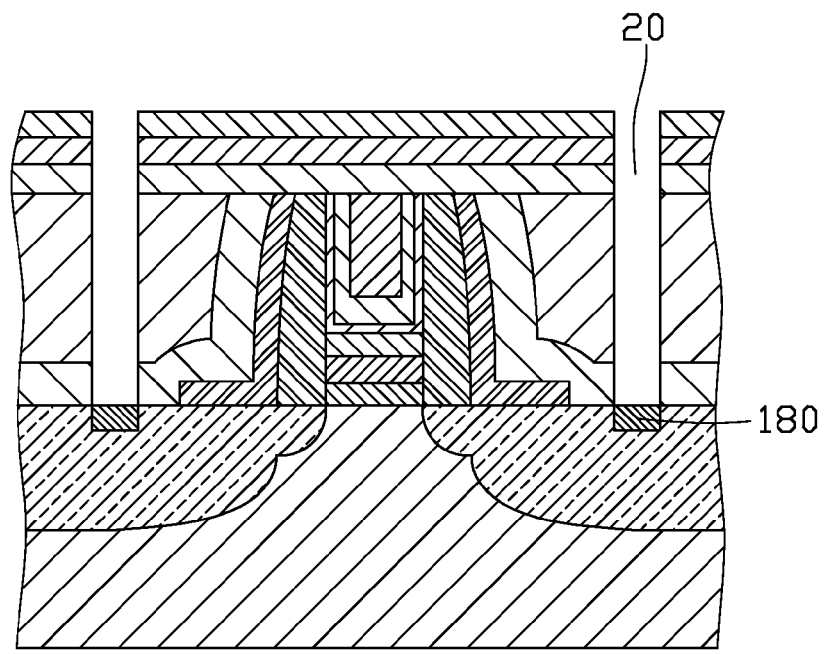
FIG. 2 is a schematic cross-sectional view illustrating a metal-oxide-semiconductor field-effect transistor according to another embodiment of the present invention.

In the above embodiment, the salicide layer 180 is formed on the source/drain structure 18 after the stress film 14 is removed. It is noted that the sequence of forming the salicide layer may be varied according to the practical requirements. For example, as shown in FIG. 2, after a contact hole 20 is formed, a surface of the source/drain structure 18 is exposed. Then, a salicide layer 180 is formed on the exposed surface of the source/drain structure 18. Under this circumstance, amorphous phases of the LDD region 17 and the source/drain structure 18 have better stress memorization efficacy.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a metal-oxide-semiconductor field-effect transistor, the method comprising steps of:
   providing a substrate, wherein a gate structure, a first spacer, a second spacer and a source/drain structure are formed over the substrate, and the second spacer comprises an inner layer and an outer layer, wherein the inner layer of the second spacer is made of silicon dioxide, and the outer layer of the second spacer is made of silicon nitride;
   thinning the second spacer, thereby retaining the inner layer of the second spacer;
   forming a stress film on the inner layer of the second spacer and the source/drain structure, and then performing an annealing process; and
   removing the stress film.

2. The method according to claim 1, wherein the substrate is a silicon substrate, and the gate structure comprises a gate dielectric layer, a barrier metal layer, a polysilicon dummy gate and a hard mask layer, wherein the first spacer is a silicon nitride layer or a multi-layered structure including a silicon dioxide layer and a silicon nitride layer.

3. The method according to claim 2, wherein the gate dielectric layer comprises an interlayer and a high-K dielectric layer, and the hard mask layer comprises a silicon nitride layer and a silicon dioxide layer, wherein the high-K dielectric layer is made of hafnium dioxide, the interlayer is made of silicon dioxide, and the barrier metal layer is made of titanium nitride.

4. The method according to claim 2, wherein the source/drain structure is formed in the substrate by performing an ion-implanting process to transform a crystal phase of the silicon substrate into an amorphous phase.

5. The method according to claim 2, wherein the step of thinning the second spacer is performed by using a hot phosphoric acid solution to etch the second spacer, so that the outer layer of the second spacer is removed but the inner layer of the second spacer is retained.

6. The method according to claim 2, wherein after the stress film is removed, the method further comprises steps of:
   forming a contact etch stop layer and an interlayer dielectric layer over the substrate;
   performing a chemical mechanical polishing process to remove a portion of the contact etch stop layer, a portion of the interlayer dielectric layer and the hard mask layer, thereby exposing the polysilicon dummy gate;
   removing the exposed polysilicon dummy gate, thereby creating a trench; and
   filling a metal gate structure into the trench.

7. The method according to claim 6, wherein the step of filling a metal gate structure is performed by sequentially filling an etch stop layer, a work function metal layer and a metal gate into the trench.

8. The method according to claim 7, wherein the etch stop layer is made of made of titanium nitride (TiN), the work function metal layer is made of titanium nitride (TiN) or titanium aluminum (TiAl), and the metal gate is made of aluminum (Al).

9. The method according to claim 1, wherein after the stress film is removed, the method further comprises a step of:
   forming a silicide layer on the source/drain structure.

10. The method according to claim 1, wherein the stress film is a silicon nitride film or a composite film including a buffer oxide film and a silicon nitride film.

11. The method according to claim 1, wherein the metal-oxide-semiconductor field-effect transistor is a p-channel metal-oxide-semiconductor field-effect transistor, and the stress film is a compressive stress film.

12. The method according to claim 1, wherein the metal-oxide-semiconductor field-effect transistor is an n-channel metal-oxide-semiconductor field-effect transistor, and the stress film is a tensile stress film.

13. The method according to claim 1, wherein the step of removing the stress film is performed by a wet etching process.

14. The method according to claim 1, further comprising steps of:
   forming a contact hole over the source/drain structure, thereby exposing a surface of the source/drain structure; and
   forming a silicide layer on the exposed surface of the source/drain structure.

* * * * *